(12) United States Patent
Boskamp et al.

(10) Patent No.: US 6,534,983 B1
(45) Date of Patent: Mar. 18, 2003

(54) MULTI-CHANNEL PHASED ARRAY COILS HAVING MINIMUM MUTUAL INDUCTANCE FOR MAGNETIC RESONANCE SYSTEMS

(75) Inventors: Eddy B. Boskamp, Menomonee Falls, WI (US); Shizhe Li, Brookfield, WI (US); Harvey E. Cline, Schenectady, NY (US); Randy O. Giaquinto, Burnt Hills, NY (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/751,682

(22) Filed: Dec. 29, 2000

(51) Int. Cl.[7] ................................................ G01V 3/00
(52) U.S. Cl. ...................................... 324/318; 324/322
(58) Field of Search ................................. 324/318, 309, 324/307, 322, 320

(56) References Cited

U.S. PATENT DOCUMENTS

| | | | |
|---|---|---|---|
| 4,816,765 A | 3/1989 | Boskamp | 324/318 |
| 4,825,162 A | 4/1989 | Roemer et al. | 324/318 |
| 4,839,595 A | 6/1989 | Boskamp | 324/318 |
| 4,859,947 A | 8/1989 | Boskamp | 324/318 |
| 4,885,539 A | 12/1989 | Roemer et al. | 324/318 |
| 4,943,775 A | 7/1990 | Boskamp et al. | 324/322 |
| 4,947,121 A * | 8/1990 | Hayes | 324/322 |
| 4,973,907 A | 11/1990 | Bergman et al. | 324/318 |
| 5,006,803 A | 4/1991 | Boskamp et al. | 324/311 |
| 5,030,915 A | 7/1991 | Boskamp et al. | 324/318 |
| 5,153,517 A * | 10/1992 | Oppelt et al. | 324/322 |
| 5,198,768 A * | 3/1993 | Keren | 324/318 |
| 5,256,971 A | 10/1993 | Boskamp | 324/318 |
| 5,361,765 A | 11/1994 | Herlihy et al. | 128/653.5 |
| 5,363,845 A | 11/1994 | Chowdhury et al. | 128/653.5 |
| 5,370,118 A | 12/1994 | Vij et al. | 128/653.5 |
| 5,394,087 A | 2/1995 | Molyneaux | 324/318 |
| 5,457,386 A * | 10/1995 | Matsunaga et al. | 324/318 |
| 5,477,146 A * | 12/1995 | Jones | 324/318 |
| 5,543,711 A | 8/1996 | Srinivasan et al. | 324/318 |
| 5,548,218 A * | 8/1996 | Lu | 324/300 |
| 5,578,925 A * | 11/1996 | Molyneaux et al. | 324/318 |
| 5,594,337 A | 1/1997 | Boskamp | 324/318 |
| 5,696,449 A | 12/1997 | Boskamp | 324/318 |
| 6,008,649 A | 12/1999 | Boskamp et al. | 324/318 |
| 6,300,761 B1 * | 10/2001 | Hagen et al. | 324/318 |

OTHER PUBLICATIONS

Song et al., A Wheel–and–Spoke Multi–Mode Receiver Coil, Proceedings of the Society of Magnetic Resonance in Medicine, vol. 3, Twelfth Annual Scientific Meeting; New York, NY, Aug. 14–20, 1993, p. 1334.

Duensing et al., Transmission Field Profiles for Transceive Phased Array Coils, Proceedings of the Society for Magnetic Resonance in Medicine, vol. 1, Eighth Scientific Meeting and Exhibition, Denver, CO, Apr. 1–7, 2000, p. 143.

* cited by examiner

Primary Examiner—Edward Lefkowitz
Assistant Examiner—Dixomara Vargas
(74) Attorney, Agent, or Firm—Carl B. Horton (57) ABSTRACT

A multi-channel phased array coil for use in a magnetic resonance (MR) system is disclosed herein. The phased array coil includes N coils configured in an array, each of the N coils having a geometric shape and overlapping with (N-1) coils to form an overlap area within the array. The geometric shape of each of the coils and the overlap area are configured to cause a mutual inductance between every pair of the coils to be less than 10 percent of the self-inductance of each of the N coils. At least four coils are provided in the phased array coil.

20 Claims, 10 Drawing Sheets

MULTI-CHANNEL PHASED ARRAY COILS HAVING MINIMUM MUTUAL INDUCTANCE FOR MAGNETIC RESONANCE SYSTEMS

BACKGROUND OF THE INVENTION

The present invention relates generally to magnetic resonance (MR) imaging and spectroscopy. More particularly, the present invention relates to multi-channel phased array receiver coils for use in MR imaging or spectroscopy.

The magnetic resonance (MR) phenomena involves providing a fairly strong static magnetic field (polarizing field $B_o$, along the z-direction in a Cartesian coordinate system denoted as x, y, and z) throughout an image volume of the subject or area of interest (e.g., one or more anatomy of a patient being studied). Of the molecules comprising the subject or area of interest within the image volume, those nuclei having magnetic moments (i.e., those having an odd number of protons) attempt to align themselves with this static magnetic field. Such orientated nuclei, i.e., in a quiescent orientation, can be nutated (by controlled amounts) when a radio frequency, (RF) pulse (excitation field $B_1$), which is in the x-y plane and which is tuned to the Larmor frequency, is applied in its vicinity. The presence of the RF pulse causes a net aligned moment, $M_z$, of the orientated nuclei to be rotated or "tipped" at a certain tipping angle into the x-y plane, to produce a net traverse magnetic moment, $M_t$. Once the RF pulse is terminated, the nutated or excited nuclei eventually return to their quiescent orientation and in the process emit certain MR echo signals, which can be detected and processed to form an MR image.

When utilizing these signals to produce MR images, linear magnetic field gradient pulses ($g_x$, $g_y$, and $g_z$) along three mutually orthogonal axes are also applied in a predetermined sequence to spatially encode the echo signals, so as to produce a map or "image" of the different nuclei populations (i.e., the various tissues) within a given image volume. Typically, the object to be imaged is scanned by a sequence of measurement cycles, in which the linear gradient pulses and the RF pulses are selectively superimposed on the static magnetic field in accordance with the particular localization method being used. The resulting set of received MR signals, also referred to as nuclear magnetic resonance (NMR) signals, are digitized and processed to reconstruct data representative of the volume of spatially encoded and nutated nuclei into an MR image, using one of many well-known reconstruction techniques.

Presently MR imaging or spectroscopy systems utilize radio frequency (RF) receiver coils to receive the echo signals emitted from the object of interest under study. The RF receiver coils may be of the type known as surface coils, which are typically smaller in size than remote coils and which are applied near, or on, the surface of a region of the object of interest (e.g., a specific anatomical portion of a patient, such as, a vertebrae, an elbow, etc.). Because the surface coil reception element can be located closer to the spins of interest, a given spin will produce a larger EMF in a surface coil than in a remote coil. The use of a surface coil also reduces noise contributions from electrical losses in the object of interest, relative to a remote coil, thereby resulting in MR images having a high signal-to-noise ratios (SNRs).

Surface coils are typically much smaller than remote coils in order to perform localized high resolution imaging of a small region of the object of interest, rather than an entire anatomical cross-section. A surface coil having a conductive loop or coil of diameter D provides the highest possible SNR for a volume of the object of interest directly below the surface coil and around approximately a depth D inside an infinite conducting half space. A surface coil of diameter D can only effectively image the region of the object of interest of lateral dimensions comparable to diameter D. Thus, surface coils, and more particularly, conductive loops, have a built-in field-of-view restriction.

As the conductive loops comprising the surface coils are decreased in size, the SNR of the MR images generated therefrom increases. However, as discussed above, when the loop size decreases (i.e., diameter D of the surface coil decreases), the field-of-view correspondingly decreases. Thus, using surface coils is a trade-off between resolution and field-of-view. Surface coils also tend to have non-uniform sensitivity to individual spins within its imaging volume, such that the received signals require additional compensation to address such inhomogeneity.

In order to take advantage of the high resolution (i.e., the high SNR) possible with surface coils while extending their field-of-view, a set of conductive loops or coils may be configured together in a given surface coil. With such a configuration, the high SNR of each single conductive loop or coil may be maintained, a larger overall field-of-view may be achieved, and simultaneous echo signal acquisition from each of the loops with uncorrelated noise therebetween may also be achieved. However, extreme care must be taken to minimize or eliminate interactions between the loops or coils (e.g., mutual inductances) through careful design of the geometry of and overlap between the loops or coils. Otherwise, mutual coupling between the loops will cause the SNR associated with each loop to degrade.

A surface coil having more than one conductive loop or coil and which is configured to minimize the mutual inductances therebetween are commonly referred to as a phased array coil or multi-channel phased array coil. Two- or three-channel phased array coils (i.e., a surface coil having two loops or three loops, respectively) may be constructed by careful adjustment of the overlap area between any two of the loops to minimize the undesirable mutual inductance (s). However, once four or more loops are included in a surface coil, designing the geometry or shape of such loops and/or the overlap areas between such loops to have simultaneously minimal mutual inductances has proven to be more difficult.

For example, when designing a four-channel phased array coil, although it is possible to minimize the mutual inductances between a given loop and each of its two adjacent loops (the loops to the right and left) by adjusting the overlapping areas therebetween, minimizing the mutual inductance between the given loop and the loop diagonal or opposite thereto is quite difficult. Thus, it is very difficult to design a four loop configuration that simultaneously minimizes all the mutual inductances between any pair of the loops.

Thus, there is a need for a four-channel phased array coil which provides a high SNR and an extended field-of-view by having all the mutual inductances between its loops be simultaneously minimized. There is a further need for a four-channel phased array coil configured to have uniform sensitivity to individual spins within the region of the object of interest being imaged. There is still a further need for a methodology for designing multi-channel phased array coils which satisfy the minimal mutual inductance requirement.

BRIEF SUMMARY OF THE INVENTION

One exemplary embodiment relates to a surface coil for receiving magnetic resonance (MR) echo signals emitted from a region of an object of interest. The surface coil includes N coils configured in an array. Each of the coils has a geometric shape and overlaps with (N−1) coils to form an overlap area within the array. The geometric shape of each of the coils and the overlap area are configured to cause a mutual inductance between every pair of the coils to be less than 10 percent of the self-inductance of a single coil. N is equal to at least four.

Another exemplary embodiment relates to a method for simultaneously acquiring multiple channels of magnetic resonance (MR) signals for reconstructing into a single MR image. The method includes providing N antenna elements, each of the antenna elements including a geometric shape. The method further includes configuring the N antenna elements into a phased array. The phased array includes an overlap area formed by the overlap of the antenna elements with each other. The method still further includes approximately nulling a mutual inductance between every pair of the antenna elements. The overlap area is in the range of between 0 and 10 percent of a total area of the phased array and N is equal to at least four.

Still another exemplary embodiment relates to a four-channel phased array coil for receiving magnetic resonance (MR) echo signals emitted from an object of interest. The coil includes four antenna elements configured to respectively provide four channels of signal reception with negligible correlated noise with each other. Each of the antenna elements having a geometric shape. Each of the antenna elements overlaps with three other antenna elements to form an overlap area of between 0 and 10 percent of a total area of the four antenna elements. A mutual inductance between every pair of the antenna elements being less than 10 percent of the self-inductance of a single coil.

BRIEF DESCRIPTION OF THE DRAWINGS

The preferred embodiment will become more fully understood from them following detailed description, taken in conjunction with the accompanying drawings, wherein like reference numerals denote like elements, in which.

DETAILED DESCRIPTION OF THE EXEMPLARY EMBODIMENTS

Figure 1:
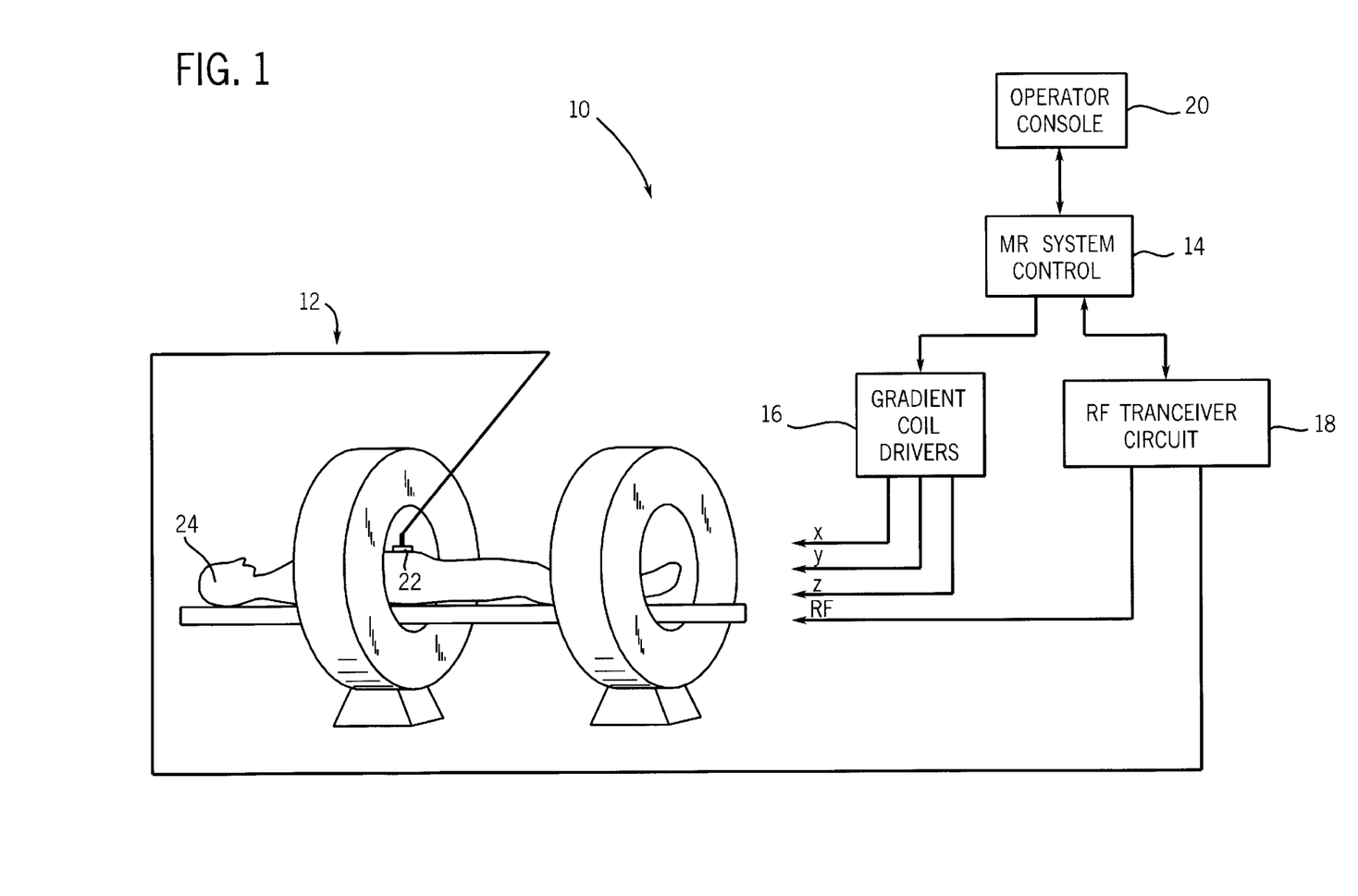
FIG. 1 is a simplified diagram of a magnetic resonance (MR) imaging system which employs an embodiment of the present invention.

Referring to FIG. 1, there is shown one embodiment of a magnetic resonance (MR) imaging system 10. MR imaging system 10 includes a magnet assembly 12, an MR system control 14, gradient coil drivers 16, a radio frequency (RF) transceiver circuit 18, an operator console 20, and a surface coil 22. MR system control 14 couples to each of gradient coil drivers 16, RF transceiver circuit 18, and operator console 20. Gradient coil drivers 16 (also referred to as gradient amplifiers) and RF transceiver circuit 18 couples to gradient coils and an RF transmitter coil, respectively, included in magnet assembly 12 (not shown). MR imaging system 10 is configured to permit operators and/or personnel (e.g., physicians and other medical personnel) to access a patient 24 positioned in magnet assembly 12 and/or surface coil 22 positioned on patient 24 during a scan or scanning session. Alternatively, magnet assembly 12 may be a closed magnet structure such that patient 24 and/or surface coil 22 is not accessible during a scan or scanning session without changing the position of patient 24 relative to magnet assembly 12.

Magnet assembly 12 includes gradient coils, a main or polarizing magnet, and an RF transmitter coil (not shown). Magnet assembly 12 is configured to polarize and nutate nuclei in a region of patient 24, and to spatially encode the emitted MR echo signals from such region of patient 24, as is well-known in the art. The gradient coils generate linear magnetic field gradient pulses that are mutually orthogonal to each other (gx, gy, and gz) to spatially encode MR signals emitted from the region of patient 24. The RF transmitter coil generates RF magnetic field pulses to nutate or tip the nuclei comprising that region. Preferably, surface coil 22 is an RF receiver coil configured to acquire or pick up the emitted MR echo signals from the region of patient 24. Surface coil 22 is a localized receiver coil that is positioned on the surface of patient 24 approximately above the region of patient 24 desired to be imaged. Surface coil 22 will be discussed in greater detail hereinafter.

MR system control 14 preferably includes a set of modules connected together by a backplane including an CPU module, a pulse generator module, a memory module, and an array processor module (not shown). MR system control 14 receives commands from an operator (via operator console 20) regarding scan parameters and sequences to be executed. MR system control 14 configures and outputs various signals (including pulse sequence data specifying the timing, strength, length, and shape of the pulses) for the remaining system components to carry out the desired scan sequence. MR system control 14 also receives sensor data and acquired image data from surface coil 22 and circuit 18 for processing (such as image data reconstruction), storage, and transmission to the operator.

Gradient coil drivers 16 output signals (e.g., x, y, and z direction signals), to excite corresponding gradient coils included in magnet assembly 12, which in turn generate magnetic field gradient pulses for spatially encoding the MR echo signals. RF transceiver circuit 18 outputs signals to excite the RF transmitter coil included in magnet assembly 12, to provide RF magnet field pulses (excitation field $B_1$).

The emitted echo signals are induced in surface coil 22 and are at or around the Larmor frequency (e.g., 64 MHz). Although not shown, more than one channel is provided in RF transceiver circuit 18 such that different echo signals can be simultaneously received by surface coil 22 and appropriately processed by circuit 18 and/or MR system control 14, as is well-known in the art. Circuit 18 preferably includes at least one pre-amplifier to receive echo signals detected by surface coil 22. As such, surface coil 22 is preferably a multi-channel phased array coil, configured to simultaneously receive echo signals from several different areas comprising the region of patient 24, to be reconstructed into a single MR image.

Operator console 20 includes a display coupled to a control panel and an input device coupled to the control panel (not shown). The display of operator console 20 can include, but is not limited to, a liquid crystal display (LCD), a light emitting diode (LED) display, a cathode ray tube (CRT) display, a plasma display, a touch screen, a projection display, a printer, a plotter, etc. The input device can include, but is not limited to, a mouse, a joy stick, a trackball, a touch screen, a light wand, a voice control device, and a custom keyboard/keypad. The control panel includes dedicated buttons, knobs, switches, slider indicators, LED indicators, actuators, etc. to provide additional interactive functionality. The operator controls and specifies scan session parameters of system 10 in real-time or quasi real-time using operator console 20. For example, operator console 20 is configured to enable the operator to control the production and visualization of MR images in system 10.

Figure 2:
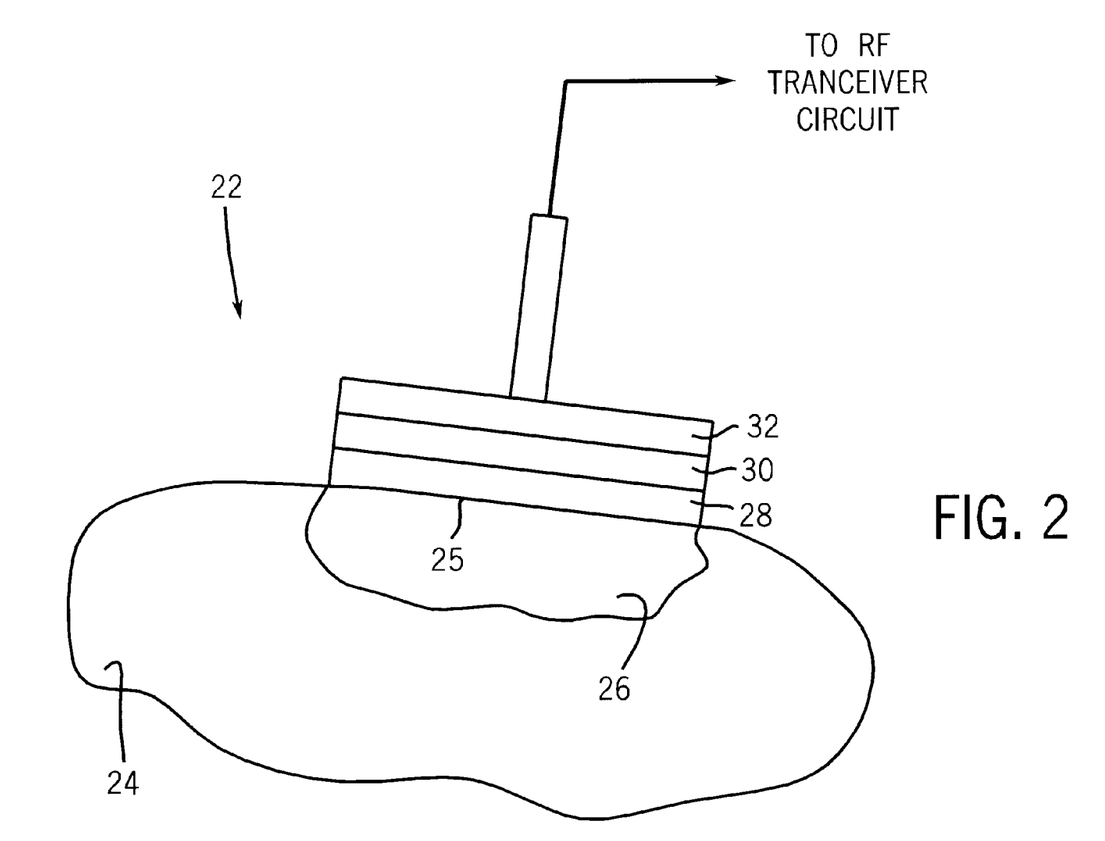
FIG. 2 is a simplified cross-sectional view of one embodiment of a multi-channel phased array coil included in the MR imaging system of FIG. 1.

Referring to FIG. 2, there is shown a simplified cross-sectional view of surface coil 22. Surface coil 22 is positioned on a surface 25 of patient 24 to image a region of interest 26 of patient 24. Preferably, surface coil 22 is positioned immediately above region of interest 26 (i.e., as close as possible to region of interest 26 to achieve the highest possible SNR and the most relevant image content). Surface coil 22 includes a bottom insulative layer 28, a loop or coil array 30, and atop insulative layer 32. Surface coil 22 may further include a fastener (e.g., velcro) to assist in coupling surface coil 22 to a patient at or near region of interest 26. Bottom insulative layer 28 is provided on surface 25, and coil array 30 is provided above bottom insulative layer 28. Top insulative layer 32 is provided above coil array 30.

Bottom insulative layer 28 is configured to serve as a bottom protective layer for coil array 30. In one embodiment, layer 28 is configured to be approximately 5 millimeters thick and is made of an insulative material. For example, layer 28 may be comprised of foam or polyurethane material. Top insulative layer 32 is similarly configured to serve as a top protective layer for coil array 30. In one embodiment, layer 32 is approximately 5 mm thick and is made of an insulative material. For example, layer 32 may be comprised of foam or polyurethane material.

Coil array 30 is preferably a printed circuit board. Coil array 30 includes a substrate layer and a circuit layer thereon. The substrate layer is configured to be a base upon which the coils or loops and associated circuitry may be appropriately positioned relative to each other. The substrate layer is a non-conductive layer and may be comprised of epoxy or RT duroid material, as is well-known in the art. The circuit layer includes a plurality of conductive loops, coils, or antenna elements positioned in a specific geometric configuration (to be described in greater detail hereinafter) and associated circuitry for appropriate excitation and timing of such a plurality of loops, such as, capacitors and switches. The plurality of loops are comprised of conductive materials, such as, copper, silver, etc. The plurality of loops are formed on the printed circuit board by fabrication techniques well-known in the art.

Although not shown, surface coil 22 may further include additional protective layers (e.g., insulative sides to fully enclose coil array 30) and other components to maximize data or signal acquisition functionality.

Surface coil 22, and in particular, coil array 30, includes more than three loops that are each of a specific geometric shape and which are positioned relative to each other such that the mutual inductance between any two loops or coils is minimized or is approximately zero (i.e., nulled). In one embodiment, surface coil 22 is a 4-channel phased array coil having four identically shaped loops or coils, in which each coil overlaps the remaining three coils (i.e., the 2 adjacent coils and the opposite or diagonal coil) by a certain amount. The mutual inductance between any two loops in surface coil 22 is less than 10 percent of the self-inductance of a single coil. Preferably, the mutual inductance between each pair of the coils is less than 5 percent of the self-inductance of a single coil.

The mutual inductance between any two coils is given by a well-known integral and which may be approximated by a double sum over short straight sections:

$$M(x,y) \Sigma\Sigma dI(x).dI(y)/r_{xy}$$

where $M(x,y)$ is the mutual inductance between the xth coil and the yth coil; $dI(x)$ and $dI(y)$ are the vector current elements for the xth and yth coils, respectively; and $r_{xy}$ is the distance between the corresponding short straight sections of the xth and yth coils. Since the mutual inductance should be preferably nulled for every pair of coils, a 4-channel phased array should have approximately $M(1,2)=M(1,3)=M(1,4)=M(2,3)=M(2,4)=M(3,4)=0$. By overlapping the adjacent coils and the opposite coil with respect to a given coil, with independently varied overlapping areas, all the mutual inductances are nulled or minimized. In this manner, a 4-channel phased array coil is configured to provide high SNR and provide a wider field-of-view than would otherwise be achievable with a remote coil or with a 1-, 2-, or 3-channel phased array coil.

Figure 3:
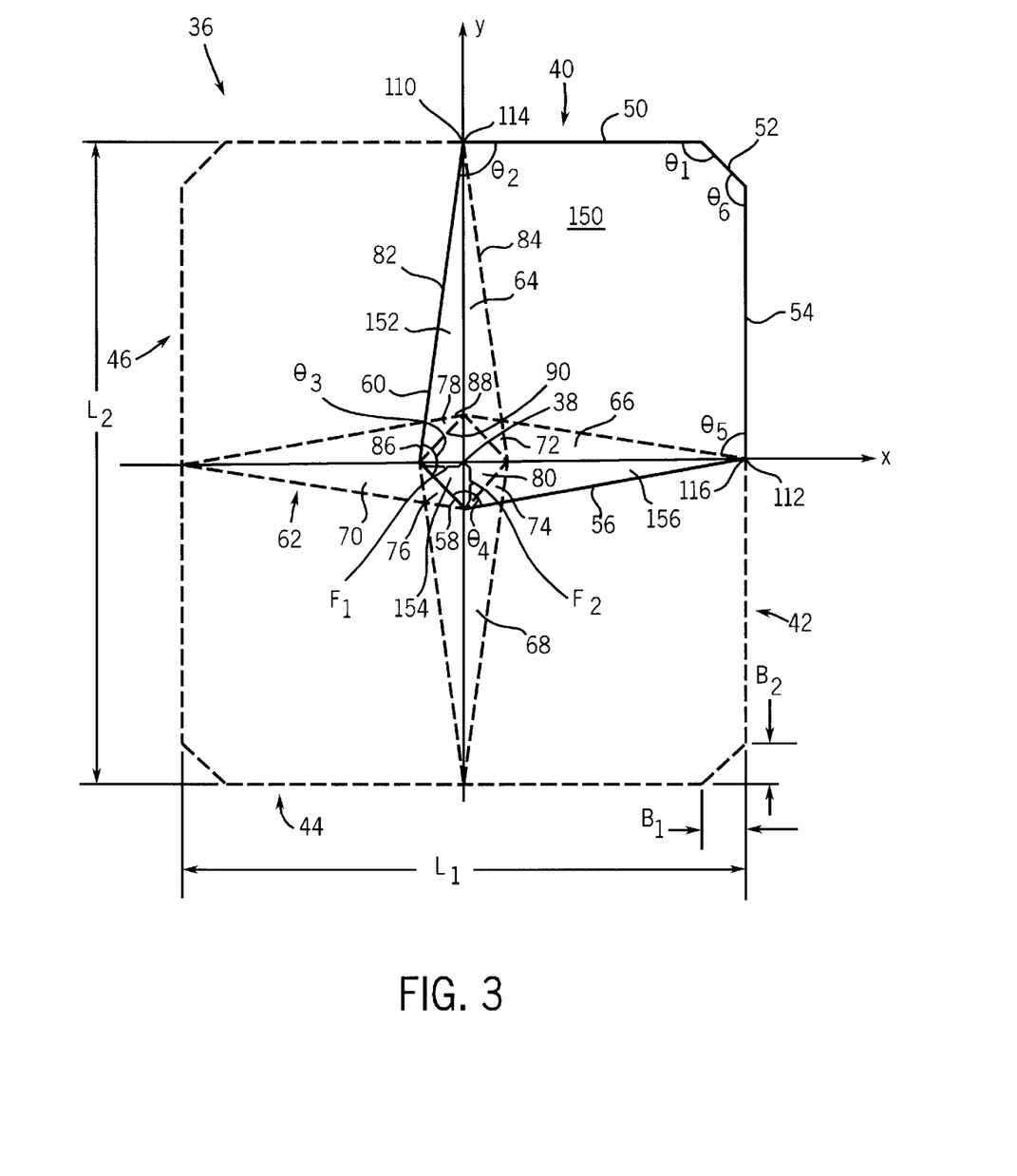
FIG. 3 is a simplified top view of one embodiment of the multi-channel phased array coil of FIG. 2.

Referring to FIG. 3, there is shown one embodiment of the geometry or geometric configuration of the plurality of loops included in the circuit layer of coil array 30. In particular, array 36 shows the geometry and overlapping areas relating to 4 loops or channels comprising a 4-channel phased array coil. Even though the 4 loops are overlapping each other, they have been configured to have little or no electromagnetic effect on each other such that when excited by RF currents, each of the 4 loops acts as an independent detector of sorts, i.e., antenna elements, that receive echo signals from different parts of region 26. These detected or received signals are then processed together to generate a single image having a field-of-view commensurate with the width or diameter of array 36.

Array 36 will be described with respect to two-dimensional x,y coordinate axes having a center or intersection point 38 and four quadrants. Array 36 is centered on these coordinate axes such that the center of array 36 is coincident with center 38. Array 36 includes loops 40–46. A first loop or coil 40 is provided substantially in a first quadrant, a second loop or coil 42 is provided substantially in a second quadrant, a third loop or coil 44 is provided substantially in a third quadrant, and a fourth loop or coil 46 is provided substantially in a fourth quadrant. Loops 40, 42, 44, 46 are identical to each other. As such, the following description of loop 40 is also applicable to each of loops 42, 44, 46. Loops 42–46 are shown in dotted lines to make it easier to show the geometry of a given loop and the overlapping areas therebetween.

Array 36 is a square with beveled corners, having a length $L_1$ along the x axis and a length $L_2$ along the y axis. $L_1$ is equal to $L_2$ in this exemplary embodiment. Array 36 may alternatively be rectangular or other shapes. For example, $L_1$ may be between 0.5 $L_2$ and 1.5 $L_2$, or vice-versa. Each beveled corner is a distance $B_1$ in from its respective side along the x axis and a distance $B_2$ in from its respective side along the y axis. $B_1=B_2$ in this embodiment. Alternatively, $B_1$ may be between 0.5 $B_2$ and 1.5 $B_2$, or vice-versa. As shown in FIG. 3, length $L_1$ is smaller than length $L_2$.

Loop 40 is a six-sided polygon having sides 50, 52, 54, 56, 58, and 60. Side 50 has a length $(L_1/2)-B_1$ and side 54 has a length $(L_2/2)-B_2$. The length of side 50 is shorter than the length of side 54. Sides 50 and 52 form an angle $\theta_1$ therebetween; sides 50 and 60 form an angle $\theta_2$ therebetween; sides 60 and 58 form an angle $\theta_3$ therebetween; sides 58 and 56 form an angle $\theta_4$ therebetween; sides 56 and 54 form an angle $\theta_5$ therebetween; and sides 54 and 52 form an angle $\theta_6$ therebetween. Side 60 lies completely in the fourth quadrant and one of its ends intersects the y axis while the other of its ends intersects the x axis. Side 58 lies completely in the third quadrant, its two ends respectively intersecting the x and y axes. Side 56 lies completely in the second quadrant, its two ends respectively intersecting the x and y axes. Sides 54, 52, and 50 form the outer perimeter of array 36.

Loop 40 is comprised of four regions (first, second, third, and fourth regions 150, 152, 154, and 156, respectively). First region 150 is a rectangle having one beveled corner. The beveled corner forms a part of the outer perimeter or circumference of array 36. First region 150 is bound by the x and y axes, and has a length $L_1/2$ along the x axis and a length $L_2/2$ along the y axis. Second region 152 is a right triangle bound by the x and y axes and side 60. Second region 152 is located in the fourth quadrant. The side of second region 152 along the x axis has a distance $F_1$. Third region 154 is a triangle bound by the x and y axes and side 58. Third region 154 is located in the third quadrant. The sides of third region 154 along the x and y axes have a distance $F_1$ and $F_2$, respectively. Fourth region 156 is a right triangle bound by the x and y axes and side 56. Fourth region 156 is located in the second quadrant. The side of fourth region 156 along the y axis has a distance $F_2$. The dimensions of $F_1$ may be 3 cm and $F_2$ may be 3 cm in an exemplary embodiment wherein $L_1=L_2=26$ cm.

The shape of loop 40 will hereinafter be referred to as a kite shape. However, it should be understood that the reference to a "kite" shape is for labeling purposes only and in no way denotes that the geometry or shape of loop 40 is limited to only shapes associated with kites.

Each of the loops overlaps both its adjacent neighboring loops and its diagonal or opposite loop (e.g., loop 40 overlaps its adjacent neighboring loops 46, 42 and its opposite loop 44). Array 36 includes an overlap area 62 formed by the overlap of loops 40–46. Overlap area 62 is a cross with pointed or tapered ends. Overlap area 62 is comprised of chevron-shaped areas 64, 66, 68, 70; triangular areas 72, 74, 76, 78; and a parallelogram-shaped area 80. Overlap area 62 has mirror symmetry with respect to both the x and y axes. Where array 36 is a square, chevron-shaped areas 64, 66, 68 and 70 are equal in size. Where array 36 is a rectangle, chevron-shaped areas 64 and 68 are identical to each other, chevron-shaped areas 70 and 66 are identical to each other, and $\theta_2$ is not equal to $\theta_5$. Each of triangular areas 72–78 are identical to each other. Overlap area 62 is formed along or centered on the x and y axes such that the center of area 80 is coincident with center 38, and each of the tapered ends is either on the x or y axis.

The distance from the center of overlap area 62 (i.e., the center of area 80) to the end of area 66 is equal to $L_1/2$. The distance from the center of area 80 to the end of area 64 is equal to $L_2/2$. Area 80 forms the center of overlap area 62. Abutting area 80 at its four sides are triangular areas 72–78. And abutting areas 72–78 are chevron areas 64–70.

Chevron area 64 includes a side 82 that forms a part of side 60 of loop 40 and a side 84 that forms a part of loop 46. The angle between sides 82 and 84 is between 15 and 20 degrees in this exemplary embodiment. Triangular area 78 includes sides 86, 88, and 90. Sides 86 and 82 comprise side 60 of loop 40. Side 88 also comprises a side of chevron area 64. Side 90 also comprises a side of area 80. The intersection point of sides 86 and 90 is on the x axis. The angle between sides 86 and 88 is between 15 and 20 degrees in this exemplary embodiment and the angle between sides 86 and 90 is between 15 and 20 degrees in this exemplary embodiment. The intersection point of sides 88 and 90 is on the y axis. These two intersection points also comprise two corners of area 80.

Overlap area 62 is formed by the two outer corners that lie on the x and y axes of each of the loops intersecting with the corresponding outer corners that lie on the x and y axes of its two adjacent loops. As shown in FIG. 3, corners 110 and 112 of loop 40 (which lie on the y and x axes, respectively) are coincident with corners 114 and 116 of loops 46 and 42, respectively, (which also lie on the y and x axes, respectively). When these intersections occur for all four quadrants, the area so bound is overlap area 62.

Each of areas 64–70 is formed by two adjacent loops overlapping. For example, area 64 is formed by the overlap of loops 40 and 46. Each of areas 72–78 is formed by the overlap of three loops. For example, area 78 is formed by the overlap of loops 40, 46, and 44. Area 80 is formed by the overlap of all four loops (i.e., loops 40–46). The widest amount of overlap of the four loops occurs along the x or y axis at an overlap width of $2F_2$ or $2F_1$.

In one embodiment, chevron area 64 has an area of 26 cm$^2$, chevron area 66 has an area of 26 cm$^2$, triangular area 78 has an area of 2 cm$^2$, and area 80 has an area of 9 cm$^2$. Preferably, overlap area 62 has an area of 104 cm$^2$ in an embodiment where $L_1=L_2=26$ cm. Overlap area 62 has an area of between 0 and 10 percent of the total area of loops 40–46. Preferably, overlap area 62 has an area of between 3 and 7 percent of the total area of loops 40–46. In this manner, a four-channel phased array coil configured to have a mutual inductance for every pair of loops of less than 10 percent of the self-inductance of a single coil is shown.

In an alternative embodiment in which array 36 is rectangular in shape, $L_1=31.5$ cm and $L_2=36.5$ cm.

Figure 4:
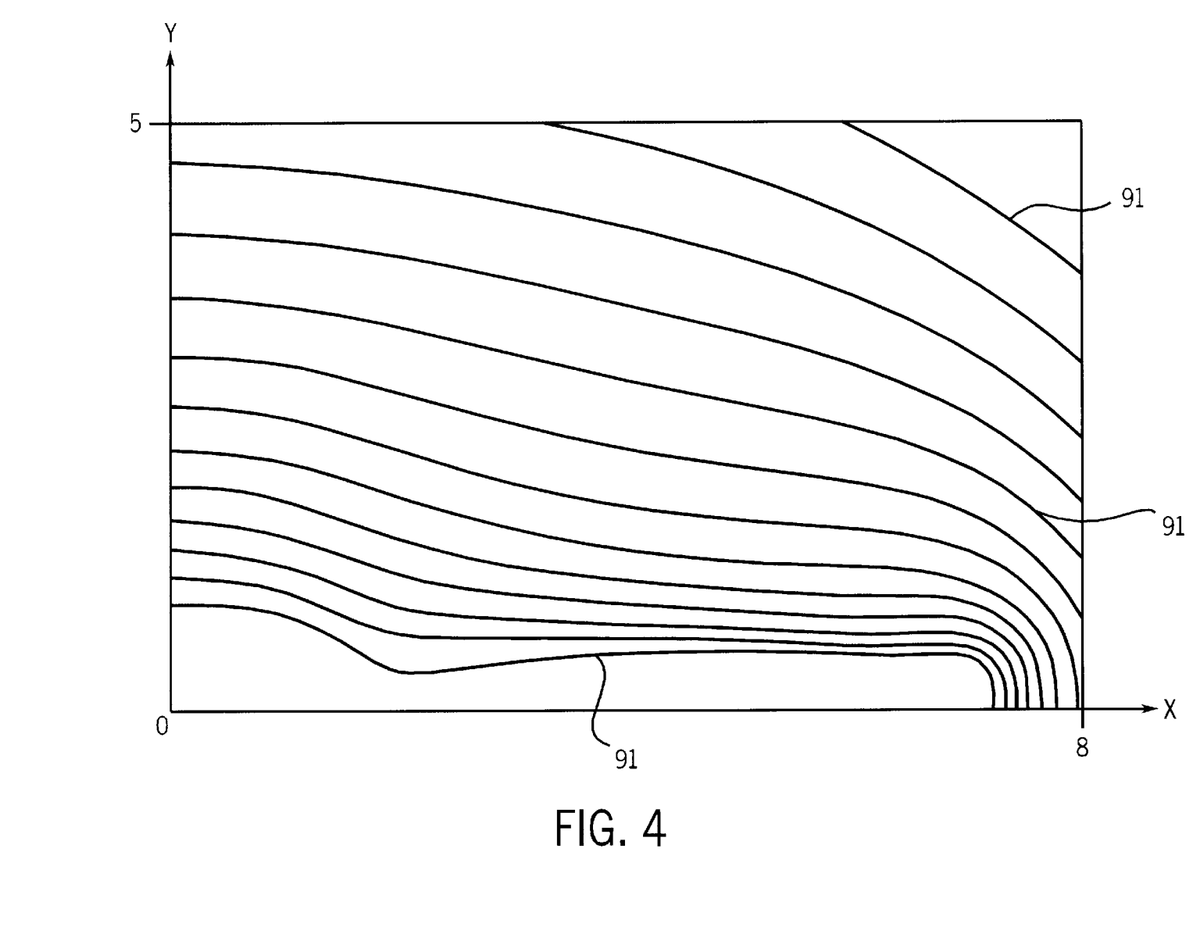
FIG. 4 is a first signal-to-noise ratio (SNR) pattern associated with the multi-channel phased array coil of FIG. 3.
Figure 5:
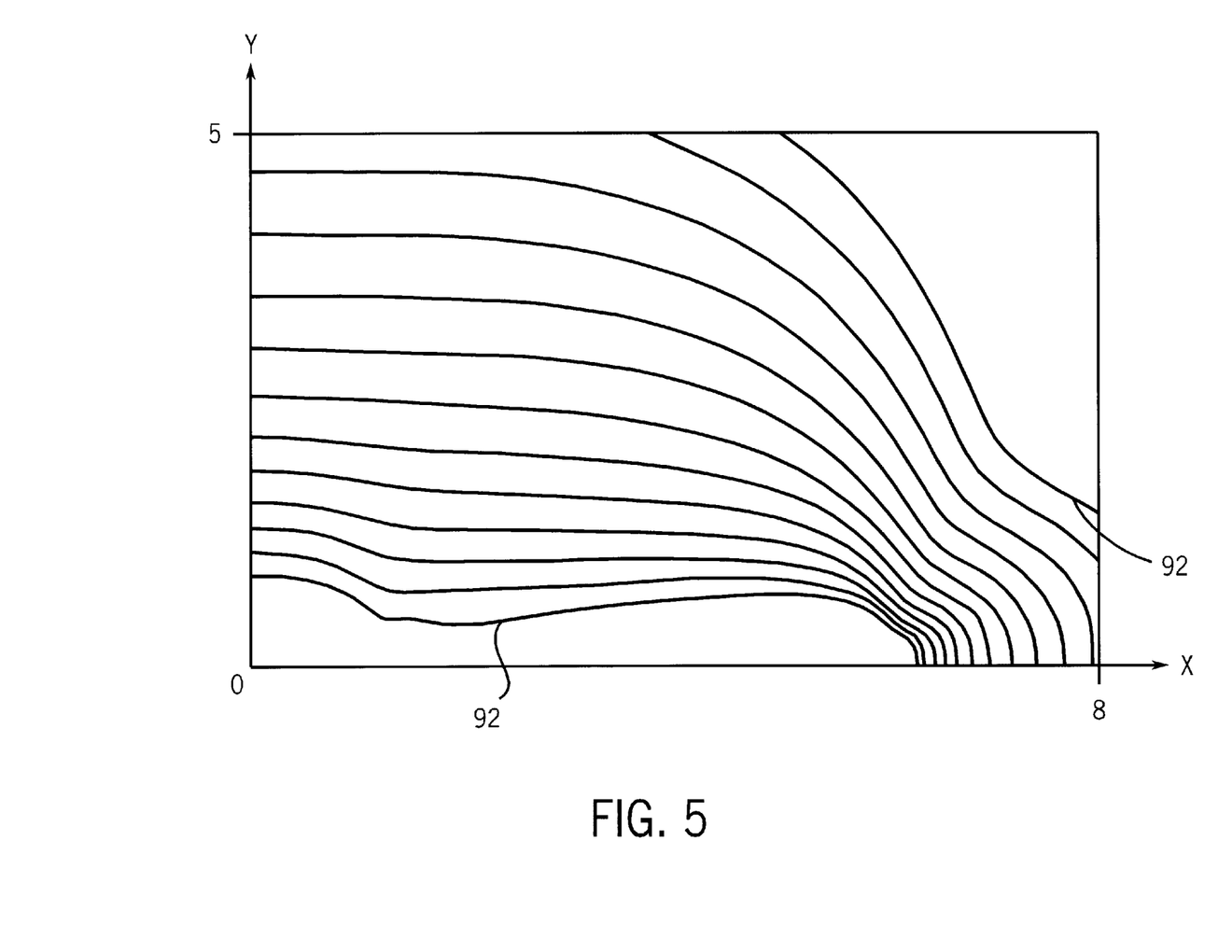
FIG. 5 is a second SNR pattern associated with the multi-channel phased array coil of FIG. 3.
Figure 6:
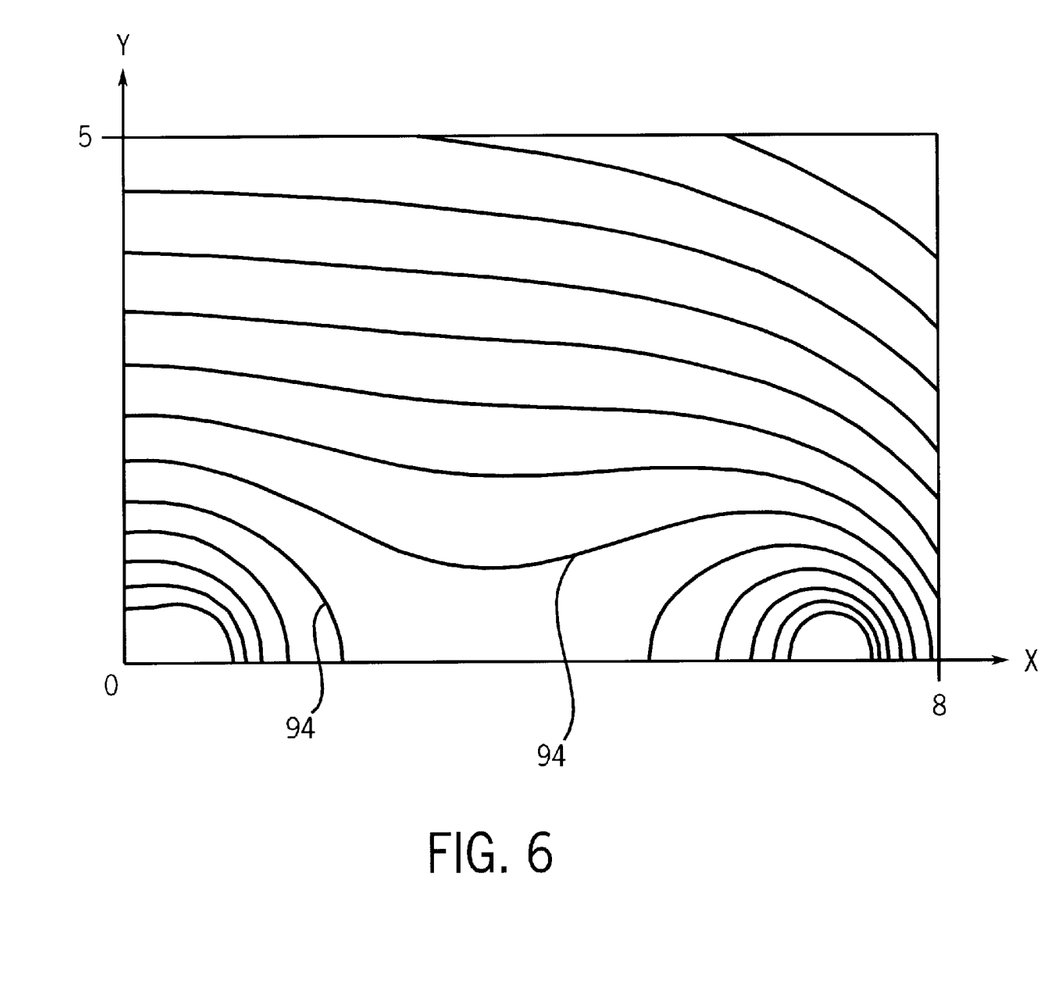
FIG. 6 is a third SNR pattern associated with the multi-channel phased array coil of FIG. 3.
Figure 7:
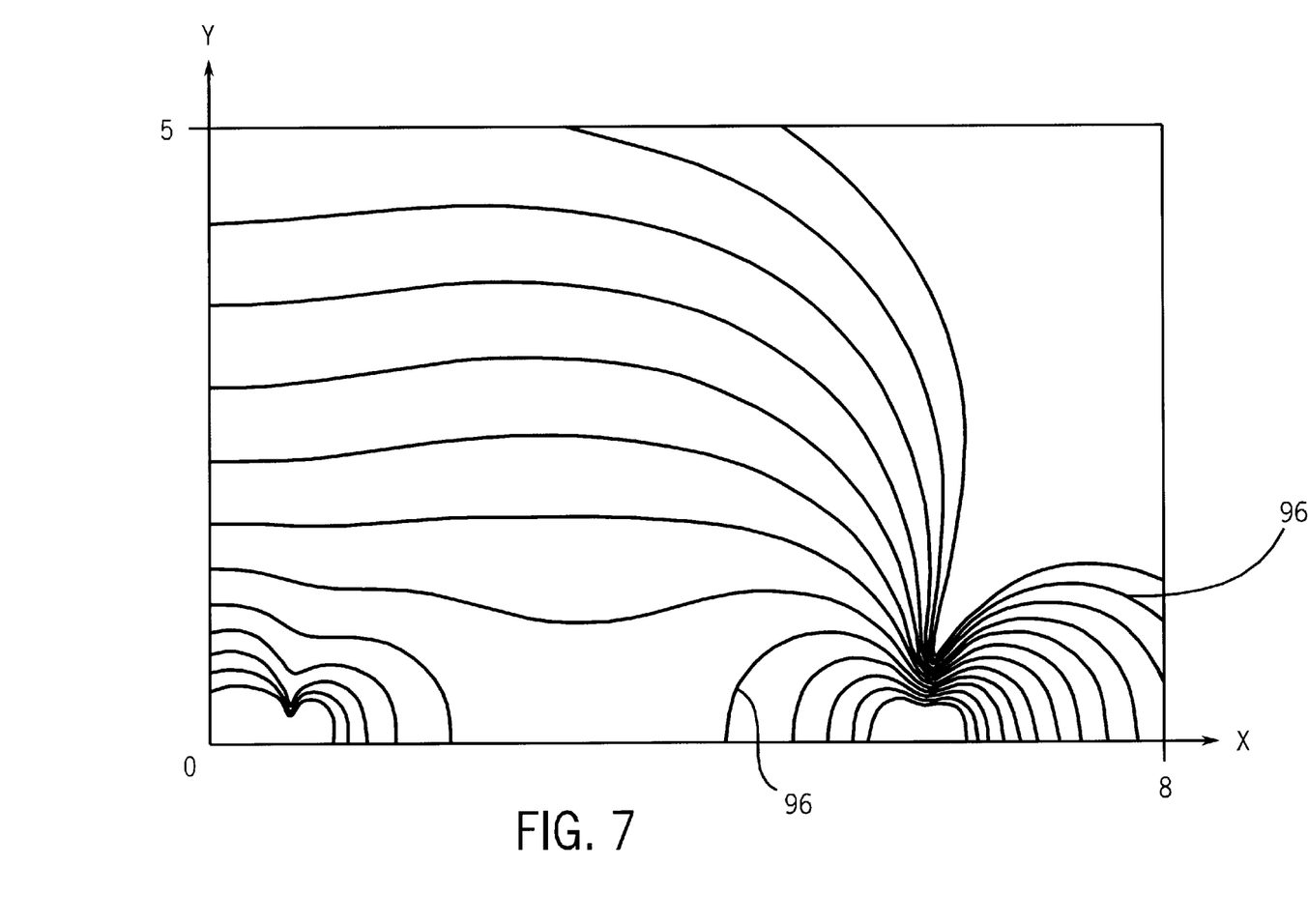
FIG. 7 is a fourth SNR pattern associated with the multi-channel phased array coil of FIG. 3.

Various signal-to-noise ratio (SNR) patterns associated with the design of array 36 are shown in FIGS. 4–7. FIG. 4 shows an SNR pattern or map comprising isocontours 91 at an axial mid-plane orientation within an imaging volume of region 26. FIG. 5 shows an SNR pattern or map comprising isocontours 92 at a sagittal mid-plane orientation within the imaging volume of region 26. FIG. 6 shows an SNR pattern or map comprising isocontours 94 at an axial orientation offset by 3 inches from the bottom surface of surface coil 22 within the imaging volume of region 26. FIG. 7 shows an SNR pattern or map comprising isocontours 96 at a sagittal orientation offset by 3.5 inches from the bottom surface of surface coil 22 within the imaging volume of region 26.

Each of isocontours 91–96 represents lines of equal amplitude of the RF magnetic field generated by array 36 if 1 Ampere was run through all loops of array 36. Only those components of the RF magnetic field that are perpendicular to the main DC magnetic field direction are shown. To get the total RF magnetic fields in the drawings, the square root of the sum of the squares of these components is calculated. In the drawings, the coil is in the xy plane of the patient. The DC magnetic field is parallel to the xy plane of the patient, for example, pointing in the y direction. In this case, only the x and z components of the RF field generate an MR signal.

Thus, adjacent lines that are closer or farther apart in a given drawing (FIGS. 4–7) represent a certain amount of increase or decrease, respectively, in the RF magnetic field strength. Ideally, flux lines 90–96 should be linear and equal distance from each other for a given map. In reality, flux lines 90–96 may be non-linear (e.g., include curvature) at certain locations because the magnetic field is not necessarily perfectly homogeneous throughout the imaging volume of region 26. The non-equal distance between adjacent flux lines represents the different sensitivities of surface coil 22 at different regions of surface coil 22.

Figure 8:
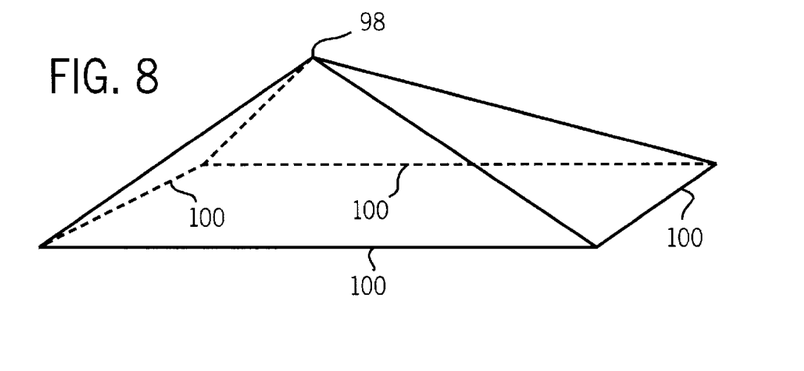
FIG. 8 is a simplified perspective view of the coil of FIG. 3.

When certain area(s) of surface coil 22 are more densely packed with unit sections of loops 40–46 than in other areas of coil 22, these densely packed areas will have greater reception sensitivity of echo signals emitted from areas of region 26 close to such areas of array 36. For example, assuming array 36 is planar, surface coil 22 including array 36 will exhibit greater reception sensitivity at its central region (i.e., where only one of loops 40–46 all overlap each other) relative to its outer perimeter region (i.e., where only any one of loops 40–46 will exist). This non-uniformity in sensitivity may create a distorted MR image or an MR image having non-uniform resolution, such as is shown near the origins of FIGS. 4–7. To counteract such differences in sensitivity, array 36, and accordingly, surface coil 22, may be configured to elevate this central region of array 36 away from region 26 relative to the remaining regions of array 36. In other words, array 36 may be non-planar. For example, shown in FIG. 8 is a perspective view of array 36 of surface coil 22 that is pyramidal in shape. The central region of array 36 (i.e., where all four loops overlap) would correspond to a top tip 98 and the outer perimeter of array 36 would correspond to approximately base 100 of the pyramidal structure.

Figure 9:
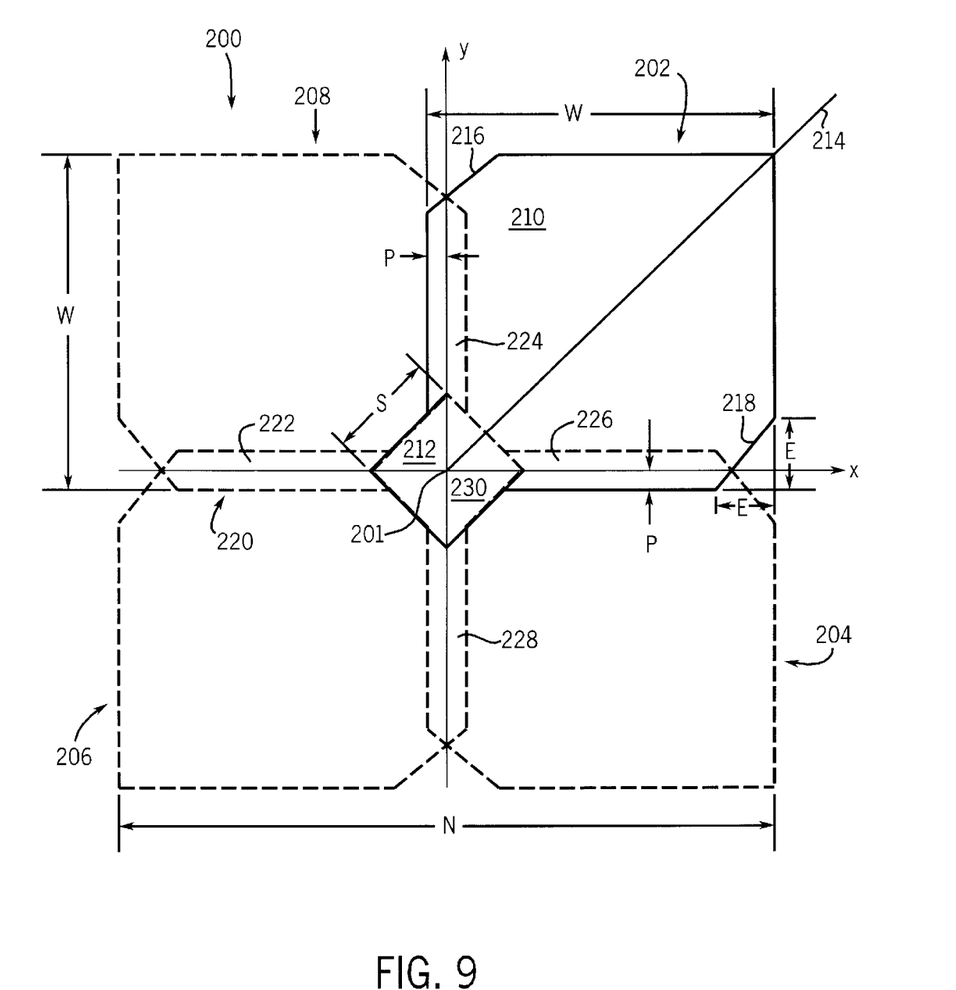
FIG. 9 is another embodiment of the coil included in the MR imaging system of FIG. 1.

Referring to FIG. 9, there is shown another embodiment of a geometry or geometric configuration of the loops or coils comprising a four-channel phased array coil comprising surface coil 22. Array 200 is designed to minimize the mutual inductance between any pair of loops therein when the loops are excited by an RF current. Array 200 will be described with respect to x and y coordinate axes having a center or intersection point 201 and four equal quadrants. Array 200 is centered on these coordinate axes such that the center of array 200 is coincident with center 201.

Array 200 comprises four sides, each side having a length N. Array 200 includes loops or coils 202, 204, 206, and 208. Loop 202 is substantially located in a first quadrant; loop 204 is substantially located in a second quadrant; loop 206 is substantially located in a third quadrant; and loop 208 is substantially located in a fourth quadrant of the x-y coordinate axes. Loops 202–208 are identical to each other and have mirror symmetry with respect to both the x and y axes. As such, the following description of loop 202 is also applicable to each of loops 204, 206, and 208. Loops 204–208 are shown in dotted lines to more easily illustrate the geometry or shape of loop 202 and the overlap area(s) in array 200.

Loop 202 is a nine-sided polygon comprised of two regions (a first region 210 and a second region 212). First region 210 is substantially square shaped with more than one beveled corner. Second region 212 is square shaped and is adjacent first region 210. Loop 202 has mirror symmetry about a line 214 drawn at 45° between the x and y axes in the first quadrant. First region 210 of loop 202 includes two beveled corners 216, 218, corner 216 above line 214 and intersecting the y axis and corner 218 below line 214 and intersecting the x axis. Each of corners 216, 218 is a distance E in from its respective sides.

First region 210 has a width W along the x and y axes. In other words, W=(N/2)+P, where P is the amount of first region 210 in each of the second and fourth quadrants. Second region 212 is centered at center 201. Second region 212 has four equal length sides, each of a length S, and four corners. The four corners of second region 212 lie along the x and y axes. Second region 212 lies equally in all four quadrants. In one embodiment, the dimension of N is 25 cm, W is 13 cm, P is 5 mm, E is 25 mm, and S is 37 mm.

The shape of loop 202 will hereinafter be referred to as a beveled square with a square protrusion. However, it should be understood that this description or reference is for labeling purposes only and in no way fully describes the exact geometry of loop 202.

Each of the loops overlaps both its adjacent neighboring loops and its diagonal or opposite loop (e.g., loop 202 overlaps its adjacent neighboring loops 208, 204 and its diagonal loop 206). The square region of each of the loops (e.g., second region 212 in the case of loop 202) is coincident in location and orientation to all overlap at the center region of array 200. The remaining region of each of the loops (e.g., first region 210 in the case of loop 202) overlaps the remaining regions of its two adjacent neighboring loops (e.g., in the case of loop 202, first region 210 overlaps the remaining regions of loops 208 and 204). In this manner, loops 202–208 form an overlap area 220 that lies along the x and y axes and which is symmetrical with respect to both and x and y axes.

Overlap area 220 includes radial areas 222, 224, 226, and 228 and a square center area 230. Square center area 230 is identical to second region 212 and is in fact the square region for all of the loops. Hence, each side of square center area 230 has a length S. Each of radial areas 222–228 has an overlap width 2P. The boundaries of radial area 224 are formed by the portion of loop 202 lying in the fourth quadrant, the portion of loop 208 lying in the first quadrant, and the boundary of second region 212. The other radial areas (areas 226, 228, 222) are similarly formed and are identical in shape to radial area 224. For example, the area of any of radial axes 222–228 may be 7 cm$^2$, and the area of square center area 230 may be 13.7 cm$^2$. Array 200 resembles a four-petaled flower.

Figure 10:
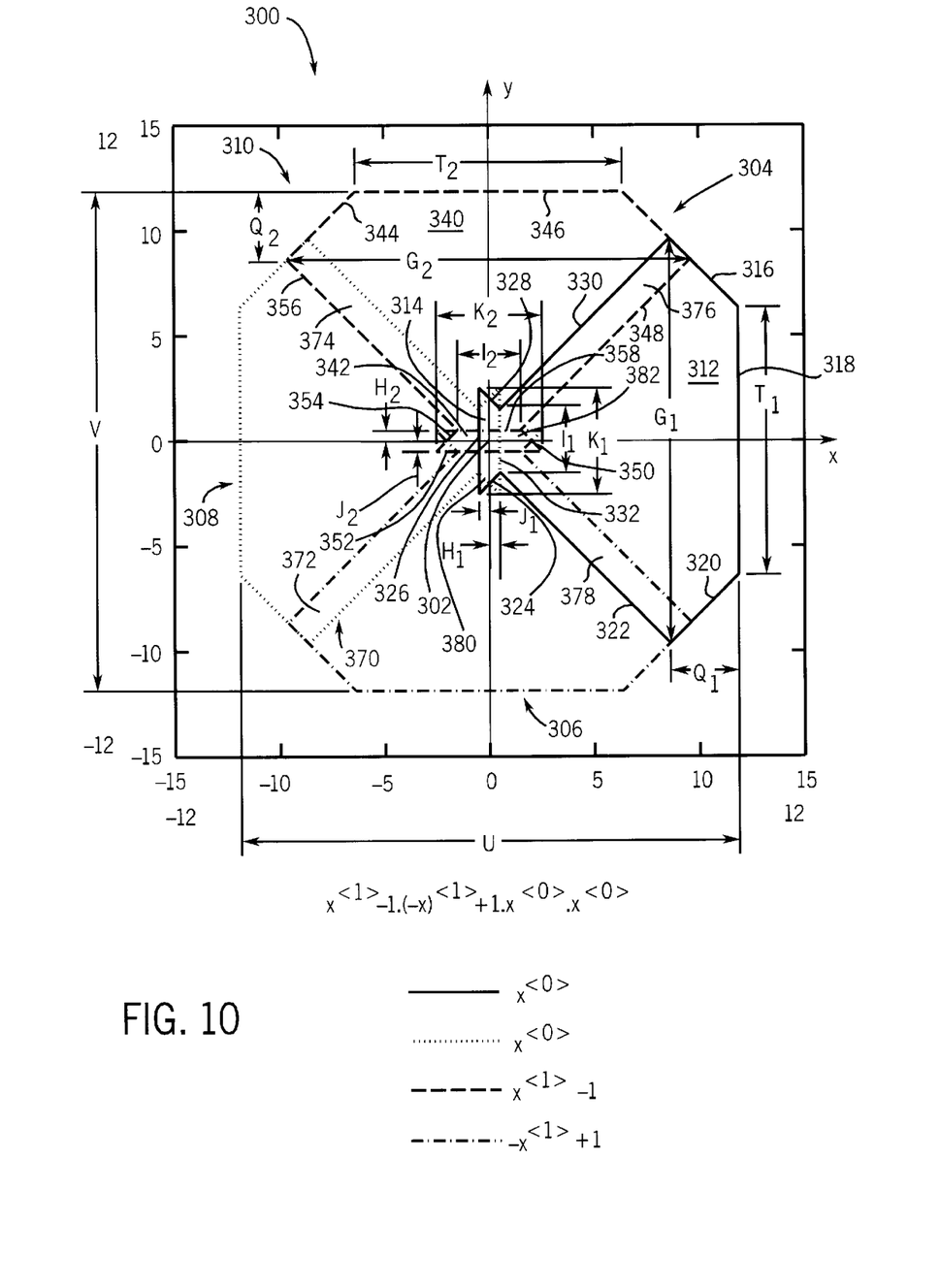
FIG. 10 is still another embodiment of the coil included in the MR imaging system of FIG. 1.

Referring to FIG. 10, there is shown still another embodiment of a geometry or geometric configuration of the loops or coils comprising a four-channel phased array coil comprising surface coil 22. Array 300 is configured to have nulled mutual inductance between any pair of the loops when these loops are excited by an RF current to receive echo signals emitted from region 26. Array 300 will be described with respect to x and y coordinate axes having a center or intersection point 302 and four quadrants. Array 300 is centered on these coordinate axes such that the center of array 300 is coincident with center 302.

Array 300 is hexagon shaped, having a width U along the x axis and a width V along the y axis. Array 300 includes loops or coils 304, 306, 308, and 310. Loop 304 is located substantially in the first and second quadrants; loop 306 is located substantially in the second and third quadrants; loop 308 is located substantially in the third and fourth quadrants; and loop 310 is located substantially in the fourth and first quadrants of the x-y coordinate axes. Loops 304 and 308 are identical to each other and are mirror images of each other with respect to the y axis. Loops 306 and 310 are identical to each other and are mirror images of each other with respect to the x axis. As such, the following descriptions of loops 304 and 310 are also applicable to loops 308 and 306, respectively. Loops 306–310 are shown in dotted lines to more easily illustrate the shape of a given loop and the overlap areas(s) in array 300.

Loop 304 is an eight-sided polygon comprised of two regions (a first region 312 and a second region 314). Loop 304 has mirror symmetry about the x axis. First region 312 is a six-sided polygon that will hereinafter be referred to as a faceted diamond shape. Second region 314 is a trapezoid shape that abuts first region 312. First and second regions 312, 314 of loop 304 include sides 316, 318, 320, 322, 324, 326, 328, 330, and 332. Due to symmetry, sides 316 and 320 are identical to each other, sides 322 and 330 are identical to each other, and sides 324 and 328 are identical to each other. Side 318 has a length $T_1$, side 332 has a length $I_1$, and side 326 has a length $K_1$. The distance from a corner formed by sides 330 and 316 and a corner formed by sides 320 and 322 is $G_1$. The horizontal distance from the y axis to the intersection of sides 324 and 322 is $H_1$. The horizontal distance from the y axis to the intersection of sides 324 and 326 is $J_1$. The horizontal distance from side 318 to the intersection of sides 320 and 322 is $Q_1$. Side 332 forms a part of each of first region 312 and second region 314.

In one embodiment, the dimension of U is 25 cm, V is 25 cm, $T_1$ is 20 cm, $I_1$ is 2 cm, $K_1$ is 3.5 cm, $G_1$ is 23 cm, $H_1$ is 5 mm, $J_1$ is 10 mm, and $Q_1$ is 3 cm. First region 312 lies half in the first quadrant and half in the second quadrant. Second region 314 lies in all four quadrants. The geometric center of second region 314 is coincident with center 302.

Loop 310 is of similar overall shape as loop 304 and is also comprised of two regions (a first region 340 and a second region 342). However, loop 310 has different dimensions from that of loop 304. Loop 310 has mirror symmetry about the y axis. First region 340 is a six-sided polygon that will hereinafter be referred to as a faceted diamond shape. Second region 342 is a trapezoid shape that abuts first region 340. First and second regions 340, 342 of loop 310 include sides 344, 346, 347, 348, 350, 352, 354, 356, and 358. Side 358 is shared by both first and second regions 340, 342. Due to symmetry, sides 344 and 347 are identical to each other, sides 356 and 348 are identical to each other, and sides 350 and 354 are identical to each other.

Side 346 has a length $T_2$, side 358 has a length $I_2$, and side 352 has a length $K_2$. The distance from a corner formed by sides 344 and 356 and a corner formed by sides 347 and 348 is $G_2$. The vertical distance from the x axis to the intersection of sides 348 and 350 is $H_2$. The vertical distance from the x axis to the intersection of sides 350 and 352 is $J_2$. The vertical distance from side 346 to the intersection of sides 344 and 356 is $Q_2$.

In one embodiment, the dimension of $T_2$ is 20 cm, $I_2$ is 2 cm, $K_2$ is 3.5 cm, $G_2$ is 23 cm, $H_2$ is 5 mm, $J_2$ is 10 mm, and $Q_2$ is 3 cm. First region 340 lies half in the first quadrant and half in the fourth quadrant. Second region 342 lies in all four quadrants. The geometric center of second region 342 is coincident with center 302.

Each of the loops overlaps both its adjacent neighboring loops and its diagonal or opposite loop (e.g., loop 304 overlaps its adjacent neighboring loops 310, 306 and its diagonal loop 308). Array 300 includes an overlap area 370 formed by the overlap of loops 304–310. Overlap area 370 includes radial areas 372, 374, 376, and 378 and central areas 380 and 382. Each of radial areas 372–378 is formed by two adjacent loops overlapping. For example, radial area 376 is formed by the overlap of first regions 312 and 340 of loops 304 and 310, respectively. Each of radial areas 372–378 has an overlap width A. Each of central areas 380, 382 is formed by the overlap of a pair of opposite loops, and in particular by the overlap of the trapezoid shaped regions of the pair of opposite loops. The overlap width of central area 380 is $J_1+H_1$ and the overlap width of central area 382 is $J_2+H_2$. For example, the area of any of radial areas 372–378 may be 7 $cm^2$, and the area of any of central areas 380, 382 may be 13 $cm^2$.

Similar to array 36, each of arrays 200 and 300 may also exhibit increased sensitivity at its central region and this may be addressed by elevating the central region away from region 26, such as shown in the pyramidal structure of FIG. 8. It is also contemplated that loops 304, 306, 308, 310 may be identical to each other such that the dimensions associated with, for example, loops 304 and 310 are the same.

Arrays 36, 200, and 300 may be approximately 10 centimeter (cm)×10 cm and have an overlap width of approximately 0.5 to 1 cm. It should be understood, however, that dimensions for arrays 36, 200, and 300 may vary depending on the SNR desired, overall field-of-view desired, system 10 performance constraints, etc. The shape of the loops or coils comprising the coil arrays may also be of a variety of shapes or hybrids of known geometric shapes including, but not limited to, rectangles, squares, circles, ellipses, eight-sided polygons, twelve-sided polygons, etc. In any case, loops of each coil are configured such that the flux in overlap regions is the same magnitude but has the opposite sign as the flux that goes through non-overlap regions of neighboring coils.

In order for a given loop in a coil array to act as an antenna element, a certain amount of capacitance is placed in series with the high inductance inherent with that given loop, to form an LC circuit which can be tuned to be an RF resonator. The applied capacitance is typically a lumped element capacitance or distributed capacitance having a value in the range of approximately 20–80 picofarads per loop. When properly tuned, each loop in a coil array will have the same operating resonant frequency (e.g., approximately 10–64 MHz). Such tuning is dependent on the applied capacitance value, the shape of the loops, and the amount of overlap between the loops.

Since each loop can be modeled as an LC circuit, coil arrays can be considered to be special cases of a flat bird cage resonator and the circuit theory (including the perturbation theory) of bird cage resonators can be utilized to design phased array coils having four or more loops. An exemplary resonator that has been folded out in the azimuthal direction is disclosed in U.S. Pat. No. 6,008,649 to Boskamp et al., which patent is herein incorporated by reference in its entirety. In the exemplary embodiment shown in FIGS. 11 and 12, a birdcage resonator is collapsed in the longitudinal direction, while one of the endrings is collapsed to a very small diameter, but it behaves the same as a birdcage. The capacitor ratios for which the degeneracy occurs depends on the shape and the number of cells. Advantageously, this exemplary resonator can read out imaging data from each loop individually.

A given coil array can be modeled as a wheel and spokes structure (such as those shown in FIGS. 11 and 12) having capacitance Cw at wheel segments 400 and capacitance Cs at the spokes 402. For a certain ratio between the capacitances at the wheel segments (Cw) and at the spokes (Cs), all the resonant frequencies associated with the mode pairs of the coil array will be at the same frequency and a given loop will have good isolation from all the other loops.

Figure 11:
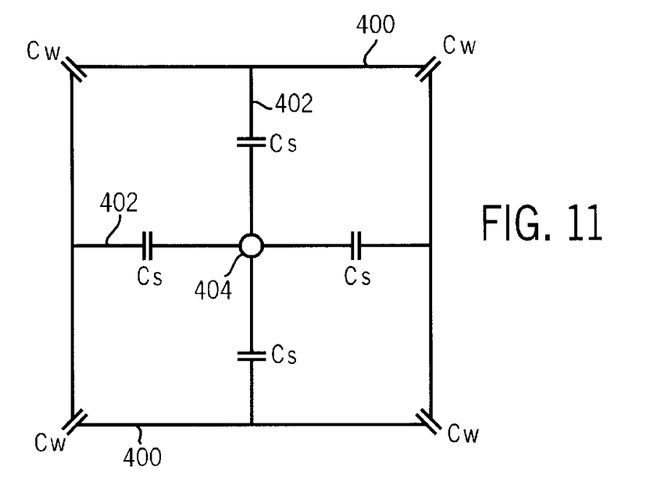
FIG. 11 is a simplified diagram of a special case of a flat bird cage structure.
Figure 12:
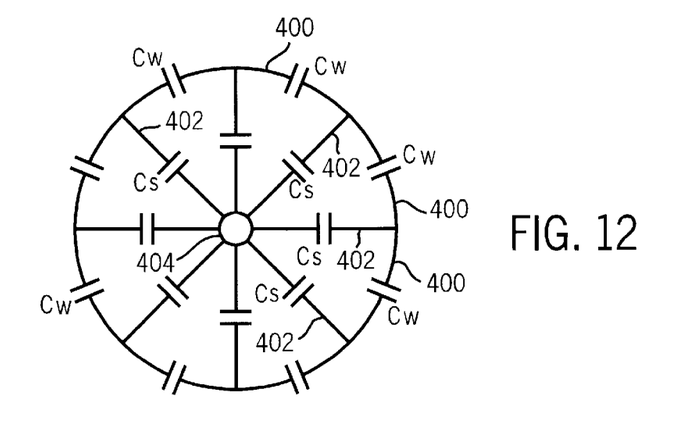
FIG. 12 is a simplified diagram of an another special case of the flat bird cage structure of FIG. 10.

As shown in FIG. 11, a four-channel phased array coil (such as arrays 36, 200, or 300) can be modeled as a square wheel and spoke structure having a capacitance Cw at each wheel segment 400 and a capacitance Cs at each spoke 402. A given loop is then represented by a closed circuit comprised of two spokes and a wheel segment. Although not shown, such a closed circuit would also include inductors or inductances (characteristic in the given loop). FIG. 12 is a modeling of an eight-channel phased array coil, in which each loop is also represented by a closed circuit comprised of two spokes and a wheel segment.

It is also contemplated that the shape of the wheel may be a polygon. To counteract the higher sensitivity of the array at its central region as discussed above, the central region of the wheel and spoke structure may be elevated farther away from the patient. Alternatively, another ring with a smaller diameter than the wheel (e.g., ring 404) may be provided at the center, from which all spokes 402 radiate outward, to shape the RF field in that area.

While the embodiments and application of the invention illustrated in the figures and described above are presently preferred, it should be understood that these embodiments are offered by way of example only. Accordingly, the present invention is not limited to a particular embodiment, but extends to various modifications that nevertheless fall within the scope of the appended claims.

What is claimed is:

1. A surface coil for receiving magnetic resonance (MR) echo signals emitted from a region of an object of interest, comprising, N coils, free of common conductive paths, configured in an array, each of the coils having a geometric shape and each overlapping with (N−1) coils to form an overlap area within the array, wherein the geometric shape of each of the coils and the overlap area are configured to cause a wherein the geometric shape of each of the coils and the overlap area are configured to cause a mutual inductance between every pair of the coils to be less than 10% of the self-inductance of each of the coils and wherein N is equal to at least four.

2. The surface coil of claim 1, wherein the mutual inductance between any pair of the coils is approximately zero.

3. The surface coil of claim 1, wherein N channels of MR echo signals are simultaneously received by the surface coil to be reconstructed into a single MR image having a field-of-view approximately equal to the dimensions of the array.

4. The surface coil of claim 1, wherein the coils are identical to each other.

5. The surface coil of claim 1, wherein the geometric shape of each of the coils is a kite shape and N is equal to four.

6. The surface coil of claim 5, wherein the overlap area is in the shape of a cross with tapered ends.

7. The surface coil of claim 1, wherein the geometric shape of each of the coils is a beveled square with a square protrusion and N is equal to four.

8. The surface coil of claim 1, wherein the geometric shape of at least one of the coils is a faceted diamond with a trapezoid protrusion and N is equal to four.

9. The surface coil of claim 1, wherein the array is configured to have symmetry about each of a horizontal center line and a vertical center line.

10. The surface coil of claim 1, wherein a central region of the array is configured to be a greater distance from the region of the object of interest than an edge region of the array to provide approximately equal sensitivity throughout the array.

11. A method for simultaneously acquiring multiple channels of magnetic resonance (MR) signals for reconstructing into a single MR image, the method comprising the steps of:
providing N electrically isolated antenna elements, each of the antenna elements including a geometric shape;
configuring the N antenna elements into a phased array, the phased array including an overlap area formed by the overlap of each antenna element with each other antenna element; and
approximately nulling a mutual inductance between every pair of the antenna elements,
wherein N is equal to at least four and the overlap area is in the range of between 0 and 10 percent of a total area of the phased array.

12. The method of claim 11, wherein the providing step includes providing the antenna elements having shapes selected from a group including a kite shape, a beveled square with a square protrusion shape, a faceted diamond with a trapezoid protrusion shape, an eight-sided polygon, an twelve-sided polygon, and a variety of other geometric shapes.

13. The method of claim 11, wherein the providing step includes providing N antenna elements that are identical to each other.

14. The method of claim 11, wherein the configuring step includes configuring the phased array to be symmetrical about each of a horizontal center line and a vertical center line associated with the phased array.

15. The method of claim 11, wherein the configuring step includes configuring a central region of the phased array to be a greater distance from a source of the MR signals than an edge region of the phased array to provide approximately equal sensitivity throughout the phased array.

16. The method of claim 11, wherein the approximately nulling step includes the mutual inductance between every pair of the antenna elements being less than 10 percent of the self-inductance of each of the antenna elements.

17. A four-channel phased array coil for receiving magnetic resonance (MR) echo signals emitted from an object of interest, the coil comprising, four antenna elements, free of common conductive paths, configured to respectively provide four channels of signal reception with negligible correlated noise with each other, wherein each of the antenna elements includes a geometric shape, each of the antenna elements overlaps with each of the three other antenna elements to form an overlap area of between 0 and 10 percent of a total area of the four antenna elements, and a mutual inductance between every pair of the antenna elements being less than 10 percent of the self-inductance of a single antenna element.

18. The coil of claim 17, wherein the geometric shape is selected from a group including a kite shape, a beveled square with a square protrusion shape, a faceted diamond with a trapezoid protrusion shape, an eight-sided polygon, an twelve-sided polygon, and a variety of other geometric shapes.

19. The coil of claim 18, wherein the overlap area comprises a central region and four radial regions, the central region located at a center of the array and each of the radial regions radiating from the central region to an edge of the array.

20. The coil of claim 17, wherein the mutual inductance between any pair of the antenna elements is nulled in accordance with the geometric shape of the antenna elements and the overlap area formed by the antenna elements.

* * * * *

UNITED STATES PATENT AND TRADEMARK OFFICE
CERTIFICATE OF CORRECTION

PATENT NO.    : 6,534,983 B1
DATED         : March 18, 2003
INVENTOR(S)   : Eddy B. Boskamp et al.

It is certified that error appears in the above-identified patent and that said Letters Patent is hereby corrected as shown below:

<u>Column 13,</u>
Lines 34 - 35, delete "wherein the geometric shape of each of the coils and the overlap area are configured to cause a"

Signed and Sealed this

Sixteenth Day of September, 2003

JAMES E. ROGAN
*Director of the United States Patent and Trademark Office*